United States Patent [19]

Saripella

[11] Patent Number: 5,821,799
[45] Date of Patent: Oct. 13, 1998

[54] LOW VOLTAGE LEVEL SHIFTING CIRCUIT AND LOW VOLTAGE SENSE AMPLIFIER

[75] Inventor: Satish C. Saripella, Starkville, Miss.

[73] Assignee: Cypress Semiconductor Corporation, San Jose, Calif.

[21] Appl. No.: 764,027

[22] Filed: Dec. 11, 1996

Related U.S. Application Data

[60] Provisional application No. 60/028,776 Oct. 25, 1996.

[51] Int. Cl.[6] .................................................. H03K 17/16
[52] U.S. Cl. ......................... 327/333; 327/318; 327/319; 327/324; 327/331; 326/80; 326/62; 326/63
[58] Field of Search .................................... 327/333, 327, 327/328, 331, 318, 319, 324; 326/62, 63, 68, 80, 81, 64–67, 69–78

[56] References Cited

U.S. PATENT DOCUMENTS

| | | | |
|---|---|---|---|
| 3,602,741 | 8/1971 | Ressler et al. | 307/264 |
| 4,375,039 | 2/1983 | Yamauchi | 307/530 |
| 4,860,257 | 8/1989 | Choi | 365/189.11 |
| 4,871,933 | 10/1989 | Galbraith | 307/530 |
| 4,910,713 | 3/1990 | Madden et al. | 365/189.11 |
| 5,023,841 | 6/1991 | Akrout et al. | 365/205 |
| 5,053,443 | 10/1991 | Sutton | 523/332 |
| 5,153,467 | 10/1992 | Mao | 307/482 |
| 5,241,225 | 8/1993 | Okajima et al. | 307/475 |
| 5,283,482 | 2/1994 | Chen | 307/475 |
| 5,392,243 | 2/1995 | Nakamura | 365/190 |
| 5,420,526 | 5/1995 | Fensch | 326/30 |
| 5,525,918 | 6/1996 | Reddy | 327/51 |
| 5,525,919 | 6/1996 | Phelan | 327/52 |
| 5,585,747 | 12/1996 | Proebsting | 327/55 |

*Primary Examiner*—Timothy P. Callahan
*Assistant Examiner*—An T. Luu
*Attorney, Agent, or Firm*—Oblon, Spivak, McClelland, Maier & Neustadt, P.C.

[57] ABSTRACT

A level shifting circuit includes first and second load, gain and reference transistors. The first and second load transistors each have a source-drain path arranged between Vdd and Vss power supply voltages, and a gate coupled to the Vss power supply voltage. The first and second gain transistors each have a source-drain path arranged between the respective source-drain paths of the first and second load transistors and the Vss power supply voltage, and gates serving as respective differential input nodes. The first and second reference transistors each have a source-drain path arranged between the Vdd and Vss power supply voltages, and a gate coupled to respective first and second nodes serving as respective differential output nodes, the first node connecting the source-drain path of the first load transistor with the source-drain path of the first gain transistor, and the second node connecting the source-drain path of the second load transistor with the source-drain path of the second gain transistor. The level shifting circuit allows for stable and high speed level shifting operation for applications in a sense amplifier, provides a reasonable gain for driving a differential stage or a cascode amplifier stage, delivers a large output differential voltage swing at a supply voltage as low as 1.5 volts, detects small input differential voltages as low as 50 millivolts and is self-biased during changes in voltage, temperature and process conditions.

27 Claims, 9 Drawing Sheets

LOW VOLTAGE LEVEL SHIFTING CIRCUIT AND LOW VOLTAGE SENSE AMPLIFIER

The present application is a non-provisional application based on provisional application Ser. No. 60/028,776 filed on Oct. 25, 1996.

BACKGROUND OF THE INVENTION

1. Field of the Invention

The present invention relates to a novel level shifting circuit and more specifically to a differential level shifting circuit advantageously used in a sense amplifier, which may, in turn, be used in a memory device, more preferably in a static random access memory (SRAM).

2. Discussion of the Background

In recent years, sense amplifiers have been designed for detecting and amplifying low voltages present as data on bit lines of memories, such as SRAM memories, etc. The sense amplifier detects the low voltage and amplifies it to a level suitable for driving a logic level in a logic family, such as ECL, FET, MOS, MOSFET, CMOS, PMOS, NMOS, BICMOS, TTL, bipolar, thin film, flash, field effect, etc.

Sense amplifiers are typically designed to operate in a differential mode, and in general, the voltages $V_{i1}$ and $V_{i2}$ of two differential signals input to the sense amplifier can be represented as follows:

$$V_{i1} = V_c + V_d$$

$$V_{i2} = V_c - V_d$$

where $V_c$ is a common direct component of $V_{i1}$ and $V_{i2}$, and $V_d$ is a differential component of $V_{i1}$ and $V_{i2}$.

In a memory, such as a MOS (metal oxide semiconductor) memory, in a computer, the value of $V_d$ is, for example, about 0.5 volts (MOS level). In other logic families, such as ECL, CMOS, etc., the value of $V_d$ may take on a value much greater than 0.5 volts. Consequently, a MOS level differential signal, generally, cannot be used to drive a logic family where $V_d \gg 0.5$ volts. As a result, a memory, such as an MOS memory, etc., may be provided with a sense amplifier circuit for changing a first level of differential signals to a second level of differential signals to drive subsequent logic levels in a logic family other than MOS, such as ECL, CMOS, etc. Therefore, the sense amplifier circuit may serve as an interface between the memory portion and the logic portion of a memory circuit.

The sense amplifier circuit typically includes a level shifting stage and an amplification stage. The level shifting stage shifts the levels of the differential input signals to a level suitable for driving the amplification stage, such as a cascode amplifier, etc.

The level shifting circuit 300 shown in FIG. 3 includes cross coupled N-channel MOS (NMOS) transistors Q3 and Q4, that typically have a power supply voltage (Vdd) of:

$$2^*V_t + \Delta V_t$$

where $V_t$ is the threshold voltage of an NMOS device (e.g., 0.7 volts) and $\Delta V_t$ is the additional gate drive (e.g., 0.4 volts) to establish current in each of the branches Q1/Q3 and Q2/Q4. The level shifting circuit 300 of FIG. 3 has several disadvantages, including a minimum power supply voltage (Vdd) of about 1.5 volts and exhibiting a self-latching behavior during Vdd transitions.

FIG. 4 shows a differential input/single-ended output sense amplifier circuit 400 for applications involving driving TTL logic levels.

FIG. 4a is a timing diagram showing signals appearing in the sense amplifier circuit 400.

FIG. 4b is a plot showing gain of the sense amplifier circuit 400 as a function of power supply voltage.

The sense amplifier circuit 400 of FIG. 4 is designed to operate on a 5 volt power supply voltage (i.e., Vdd equals 5 volts) and detect differential input voltages ($\Delta V_{i1,i2}$) of about 1.3 volts, as shown in FIG. 4a. However, the gain ($G_{400}$) of the sense amplifier circuit 400 decreases rapidly at power supply voltages less than about 2 volts, as shown in FIG. 4b.

However, the level shifting circuit 300 of FIG. 3 exhibits a self latching behavior during Vdd transitions, and has a minimum power supply voltage (Vdd) of about 1.5 volts. The sense amplifier circuit 400 of FIG. 4 has a minimum power supply voltage that leads to unreliable operation at modern and/or future power supply voltages (e.g., 3.3 Volts or less, 2.5 volts or less, 1.8 volts or less; see "Memory 1996", published by Integrated Circuits Engineering Corp., Scottsdale Ariz. pp. 13-1 and up).

SUMMARY OF THE INVENTION

Accordingly, one object of this invention is to provide a novel level shifting circuit for performing a stable and high speed level shifting operation for applications in or as a sense amplifier.

Another object of the present invention is to provide a novel level shifting circuit that provides a reasonable and/or reliable gain for driving a differential stage or a cascode amplifier stage for applications in or as a sense amplifier.

It is also an object of the present invention to provide a novel level shifting circuit that can deliver a large output differential voltage swing at a power supply voltage as low as 1.5 volts relative to similar level shifting circuits or sense amplifier circuits designed to operate at 5 volts.

It is also an object of the present invention to provide a novel level shifting circuit that can detect small input differential voltages (e.g., as low as 50 millivolts) relative to similar level shifting circuits or sense amplifier circuits designed to operate at 5 volts.

It is yet another object of the present invention to provide a novel level shifting circuit with a configuration that is self-biased during a change in voltage, temperature and/or process conditions.

It is yet another object of the present invention to provide a novel level shifting circuit that can drive an amplification stage, such as a cascode amplifier, of a novel two-stage sense amplifier circuit.

These and other objects are achieved according to the present invention by providing a new and improved level shifting circuit including (1) first and second load transistors each having (a) a source-drain path arranged between the first and second power supply voltages and (b) a gate coupled to one of the first and second power supply voltages; (2) first and second gain transistors each having (a) a source-drain path arranged between the respective source-drain paths of the first and second load transistors and one of the first and second power supply voltages and (b) a gate; and (3) first and second reference transistors each having (a) a source-drain path arranged between the first and second power supply voltages and (b) a gate coupled to respective first and second nodes, the first node connecting the source-drain path of the first load transistor with the source-drain path of the first gain transistor, and the second node connecting the source-drain path of the second load transistor with the source-drain path of the second gain transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
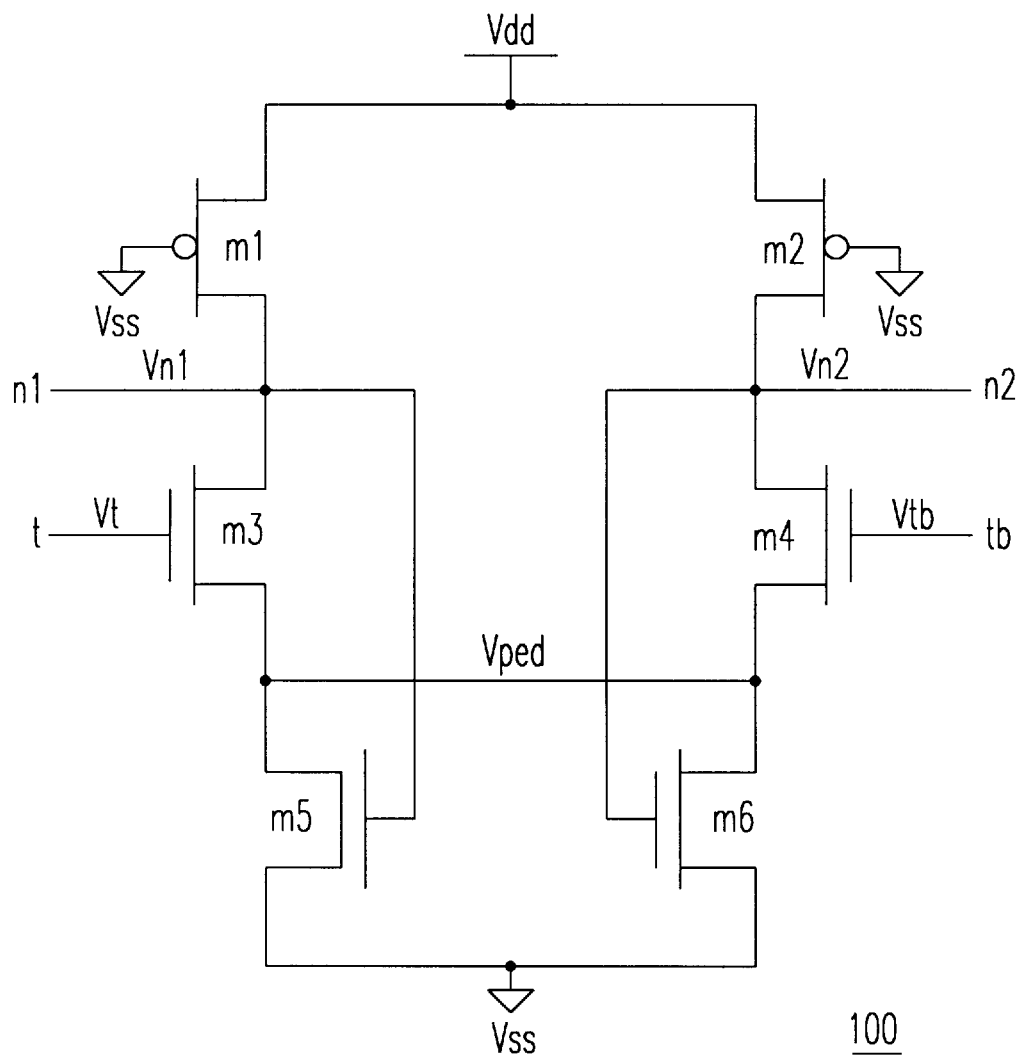
FIG. 1 is a level shifting circuit according to the present invention.

Referring now to the drawings, wherein like reference numerals designate identical or corresponding parts throughout the several views, and more particularly to FIG. 1 thereof, which shows an exemplary embodiment of the present level shifting circuit 100 including P-channel MOS (PMOS) transistors m1 and m2, and N-channel MOS (NMOS) transistors m3–m6. Transistors m1–m6 may have opposite polarities (e.g, N-channel rather than P-channel), if an appropriate inverting device is employed or if the circuit is designed to operate in an oppositely polarized environment (e.g., PMOS rather than NMOS circuitry).

Figure 1A:
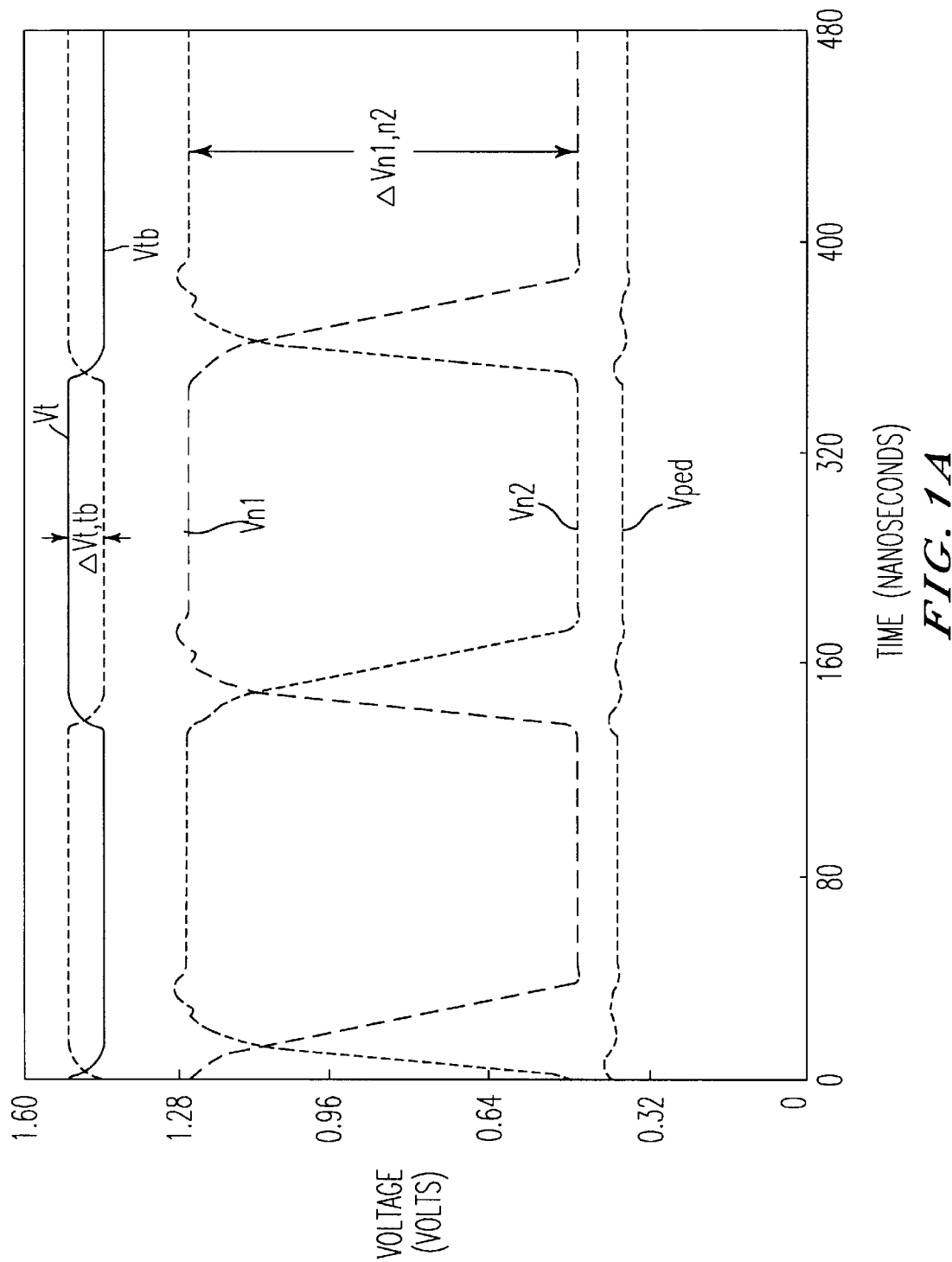
FIG. 1a is a timing diagram showing signals appearing in the level shifting circuit of FIG. 1 according to the present invention.

FIG. 1a is a timing diagram showing signals appearing in the level shifting circuit 100 of FIG. 1.

Figure 1B:
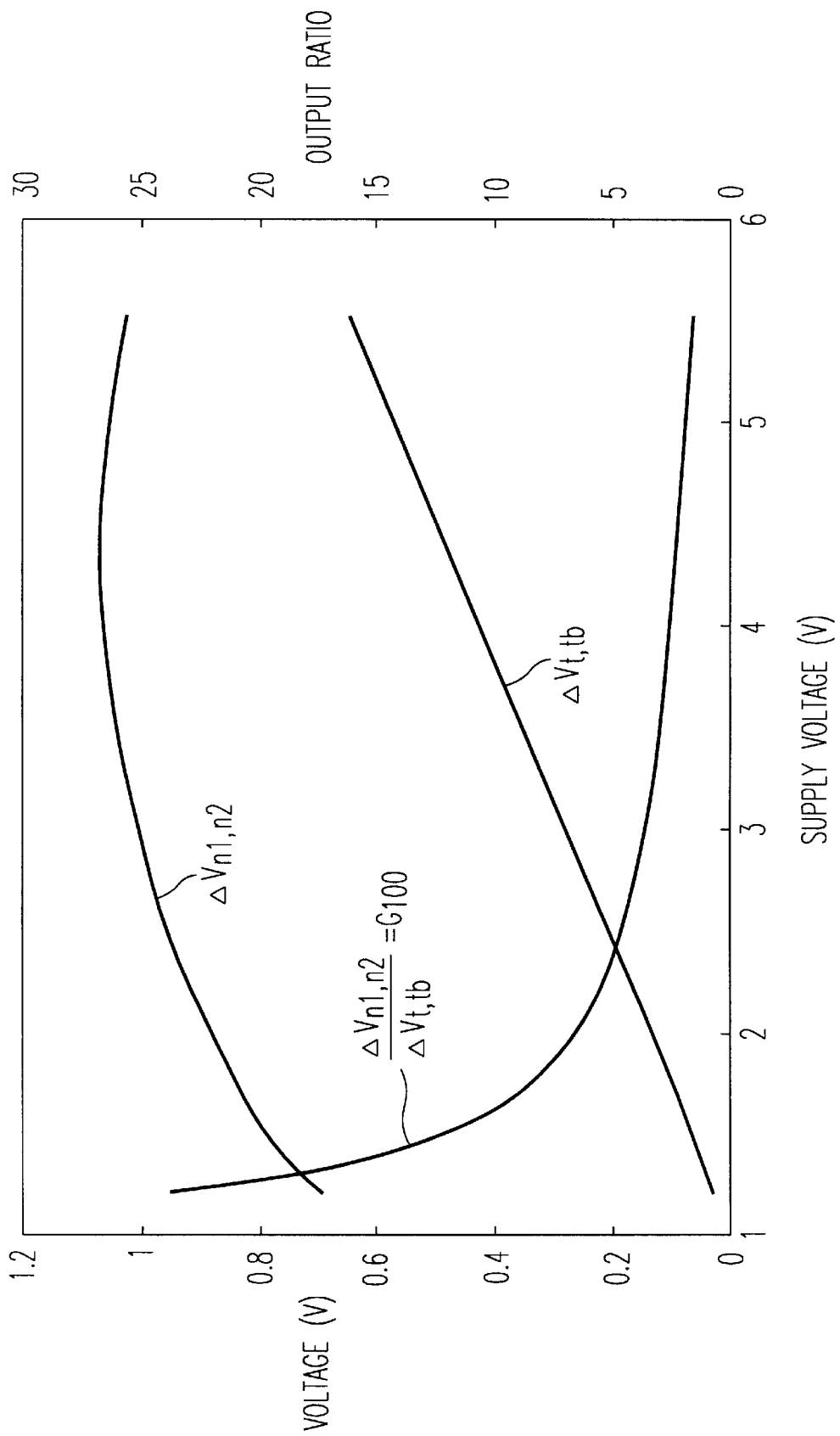
FIG. 1b is a plot showing gain of the level shifting circuit of FIG. 1 as a function of power supply voltage according to the present invention.

FIG. 1b is a plot showing gain of the level shifting circuit 100 of FIG. 1 as a function of power supply voltage.

The operation of the level shifting circuit 100, according to the present invention, will now be described with references to FIGS. 1, 1a and 1b.

The gain ($G_{100}$) of the level shifting circuit 100 is set by transistors m1, m2, m3 and m4. The small-signal voltages $V_{n1}$ and $V_{n2}$ at output nodes n1 and n2 are level shifted replicas of the small-signal voltages $V_t$ and $V_{tb}$ at input nodes t and tb, for example, as shown in FIG. 1a. The combined gate drive on m5 and m6 is an average of the voltage on nodes n1 and n2. Hence, node Vped generates a step voltage determined by voltage, temperature and/or process conditions. Consequently, the above configuration may be entirely self-biasing.

In a memory, such as an SRAM memory, etc., it is desirable that the bit lines operate at voltages at or near the power supply voltage (Vdd) during low voltage operation, for reasons pertaining to read disturbances and capacitance increases due to low voltage operation, and/or for reliability. Furthermore, Vdd may not fall in the common mode range of a differential amplifier, hence, any differential signal that is generated on a bit line should be level shifted so that it may drive a differential amplifier, such as a cascode amplifier circuit, etc., in order to obtain a reasonable and/or reliable gain.

System ground (Vss), a substrate voltage or a back bias may be chosen as a reference node. Preferably, system ground (Vss) provides the reference voltage at reference nodes to more advantageously enable low Vdd operation.

Figure 4:
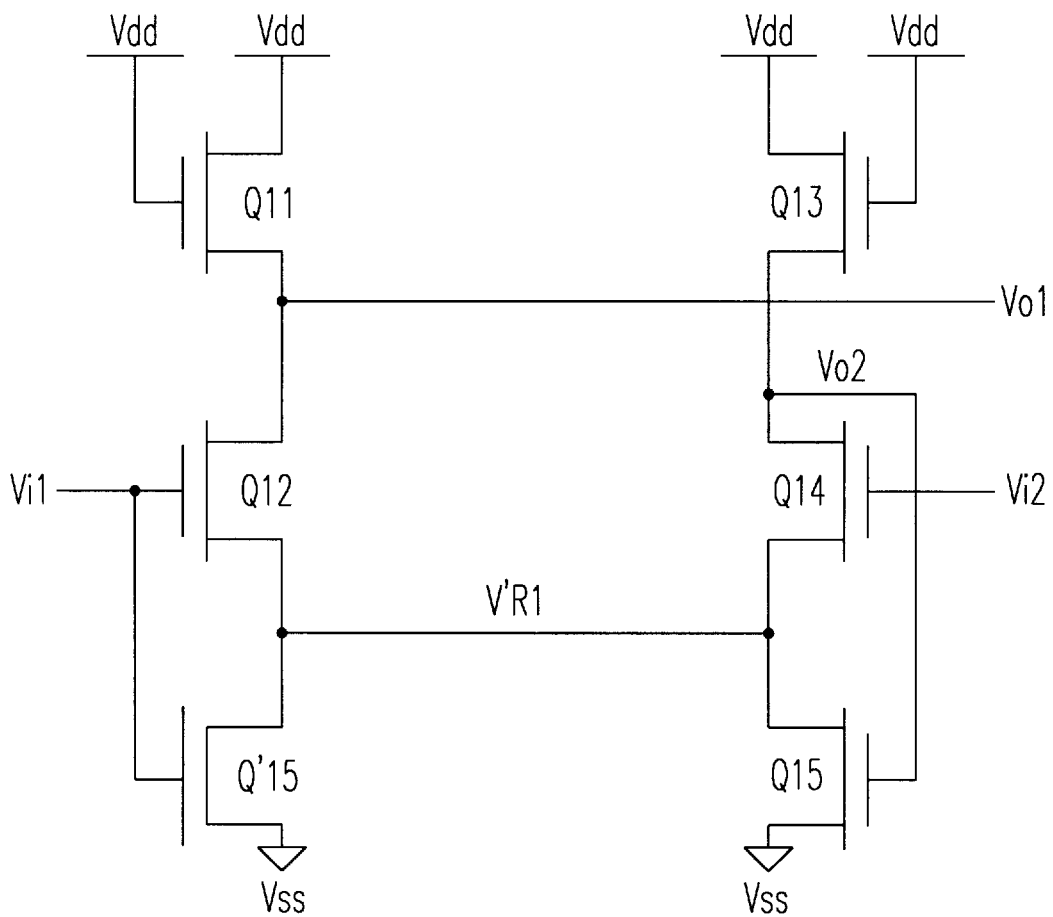
FIG. 4 is a sense amplifier circuit designed to operate at a high voltage relative to the operating voltage of the level shifting circuit of FIG. 1.
Figure 4A:
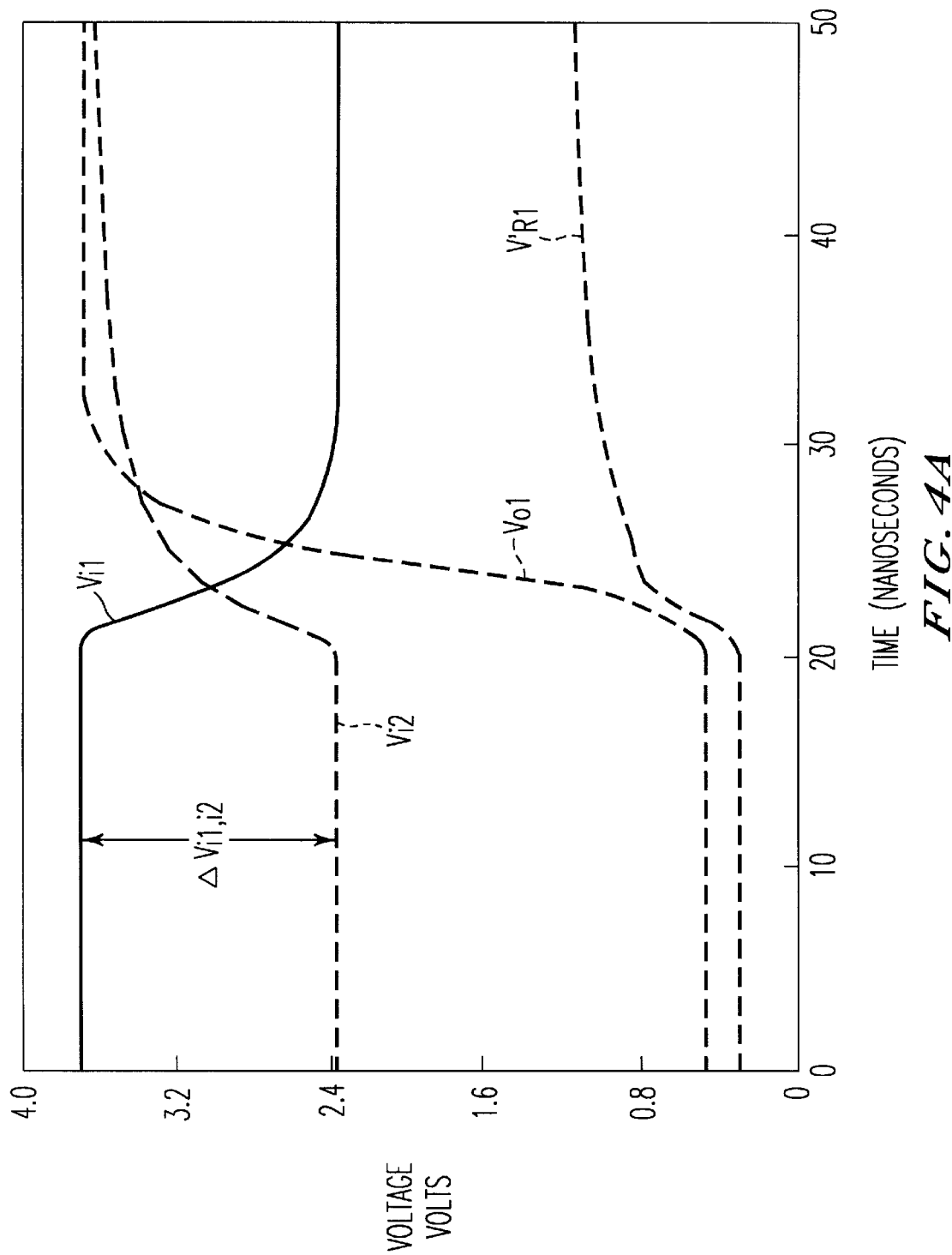
FIG. 4a is a timing diagram showing signals appearing in the sense amplifier circuit of FIG. 4.
Figure 4B:
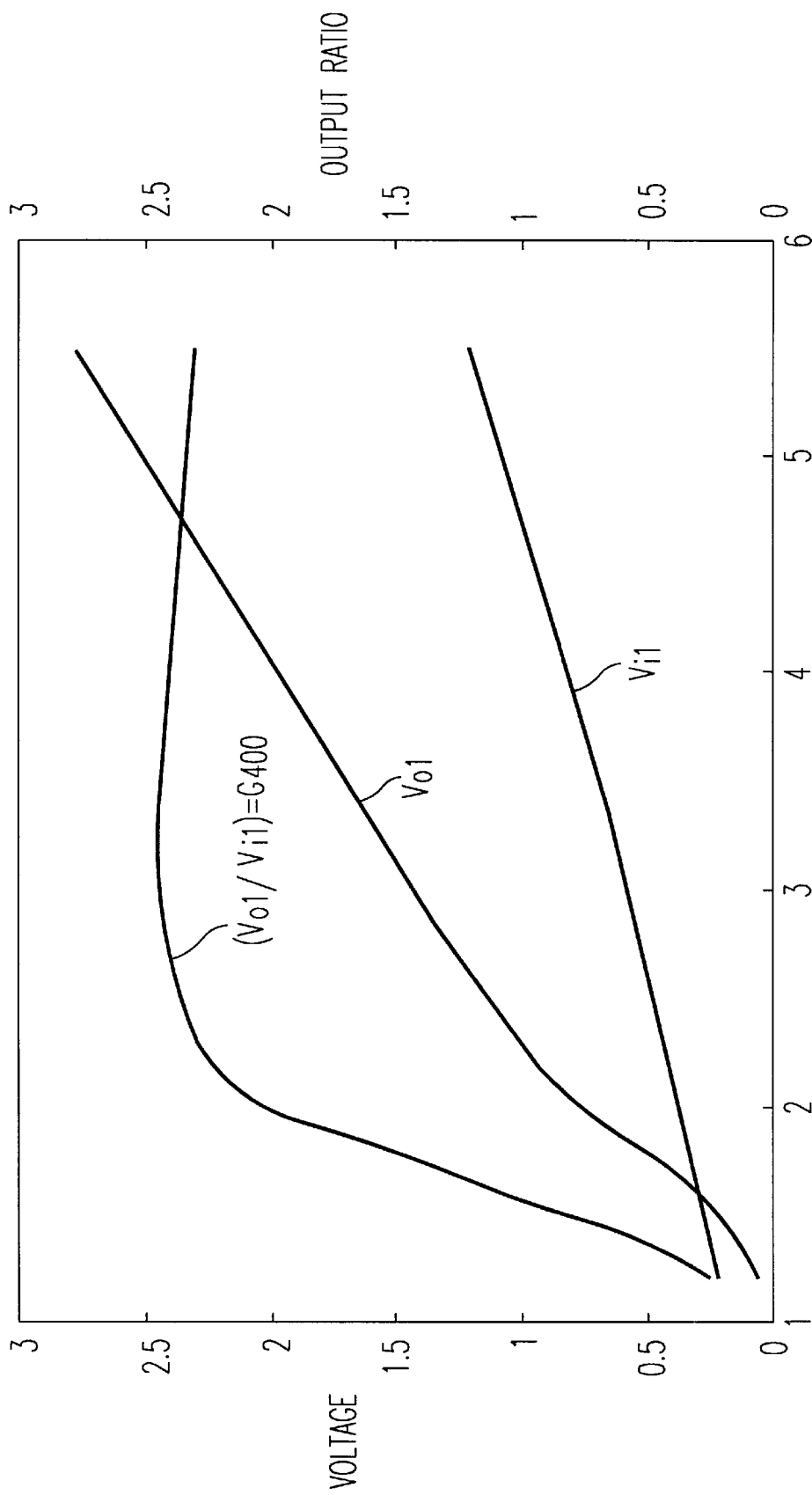
FIG. 4b is a plot showing gain of the sense amplifier circuit of FIG. 4 as a function of power supply voltage.

The present level shifting circuit 100 advantageously generates a level shifted signal ($\Delta V_{n1,n2}$) with large gain ($G_{100}$), e.g., relative to the sense amplifier circuit 400 of FIG. 4.

The gain ($G_{100}$) of the level shifting circuit 100 is set by transistors m1, m2, m3, and m4 as previously noted. For a first order analysis, the connection at node Vped may be ignored. Analyzing the left branch m1/m3/m5 of the level shifting circuit 100, m5 provides negative feedback on m3 and the gain ($G_{100}$) on node n1 is determined by the combined loop gain of the two devices m5/m3. Similarly, analyzing the right branch m2/m4/m6 of the level shifting circuit 100, m6 provides negative feedback on m4 and the gain ($G_{100}$) on node n2 is determined by the combined loop gain of the two devices m6/m4. However, the presence of node Vped improves the gain ($G_{100}$) on both nodes n1 and n2.

The above relationship may be explained by the following analysis. An increase in the gate drive of transistor m5 is compensated by a decrease in the gate drive of transistor m6. Similarly, a decrease in the gate drive of transistor m5 is compensated by an increase in the gate drive of transistor m6. This results in a constant conductance and a constant voltage bias on node Vped, determined by the power supply voltage, temperature, and/or process conditions. Therefore, it is reasonable to assume node Vped to be at a/c ground, and the gain of each branch is determined by gains (transconductances) $g_{m3}$, and $g_{m4}$ of transistors m3 and m4 and conductances $g_{ds1}$, $g_{ds2}$, $g_{ds3}$ and $g_{ds4}$ of the source-drain paths of transistors m1–m4, according to the following equations:

$$V_{n1}/V_t = g_{m3}/(g_{ds1}+g_{ds3})$$

$$V_{n2}/V_{tb} = g_{m4}/(g_{ds2}+g_{ds4})$$

where $V_{n1}$ and $V_{n2}$ are small-signal voltages at output nodes n1 and n2, and $V_t$ and $V_{tb}$ are small-signal voltages at input nodes t and tb.

The level shifting circuit 100 configured as described above can deliver large differential output voltage swings ($\Delta V_{n1,n2}$) on nodes n1 and n2, for example, as shown in FIG. 1a, at a power supply voltage as low as 1.5 volts and in some embodiments at a power supply voltage as low as 1.2 volts, for example, as shown in FIG. 1b. Accordingly, the present level shifting circuit 100 may detect small voltage swings on bit lines of a memory array, such as an SRAM memory, etc., that operates at a power supply voltage as low as:

$$V_t + \Delta V_t$$

where $V_t$ is the threshold voltage of a PMOS device (e.g., −0.7 volts) and $\Delta V_t$ is the additional gate drive (e.g., 0.4 volts) to establish current in each of the branches m1/m3/m5 and m2/m4/m6.

As previously discussed, a two-stage sense amplifier typically includes a level shifting stage and an amplification stage. The level shifting stage, according to the present invention, may be performed by the level shifting circuit 100 of FIG. 1, as previously discussed. The amplification stage, according to the present invention, may be performed, for example, by a cascode amplifier circuit, exemplified by the circuit 200 shown in FIG. 2. By coupling the circuits of FIGS. 1 and 2, through nodes n1 and n2 shown in each figure, the differential output signal on nodes n1 and n2 of the level shifting circuit 100 may be further amplified by the cascode amplifier circuit 200.

Figure 2:
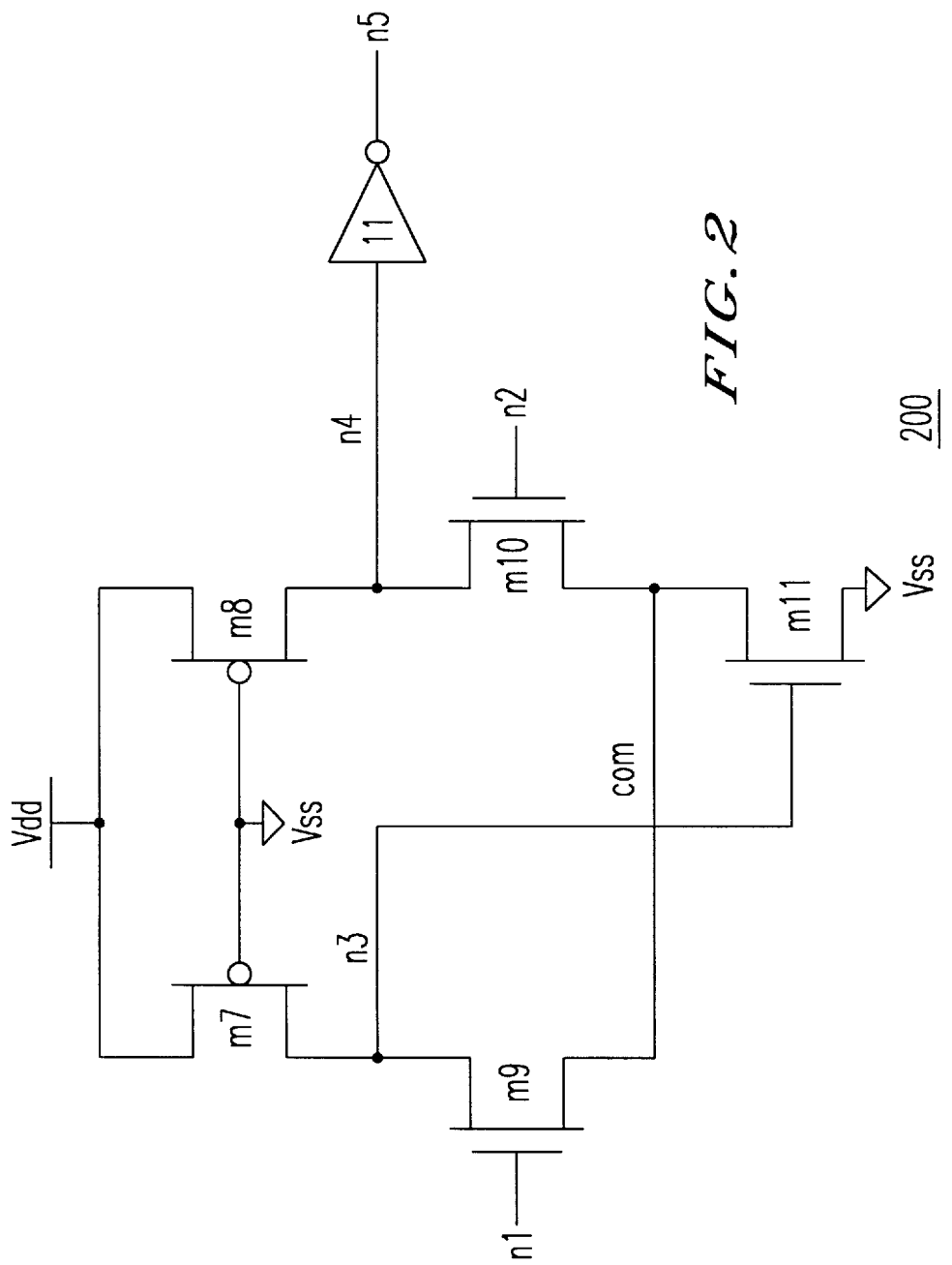
FIG. 2 is a cascode amplifier which may be used in conjunction with the level shifting circuit of FIG. 1 according to the present invention.
Figure 3:
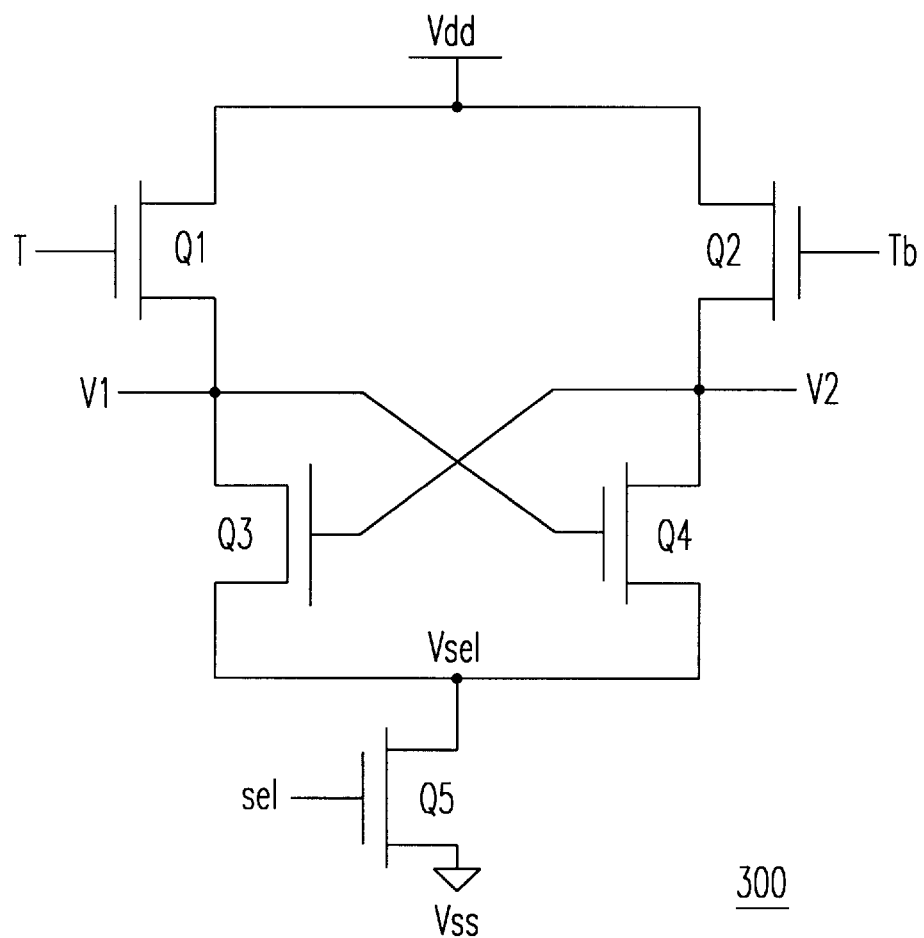
FIG. 3 is a level shifting circuit designed to operate at a high voltage relative to the operating voltage of the level shifting circuit of FIG. 1.

In FIG. 2, the cascode amplifier circuit 200 includes NMOS transistors m7–m11. The cascode amplifier circuit 200 may be used to drive subsequent logic, for example, a CMOS inverter I1, etc. The cascode amplifier circuit 200 receives as an input, at the gates of transistors m10 and m11, the differential signals obtained on nodes n1 and n2 of the level shifting circuit 100 of FIG. 1. The input differential signals are then amplified to a level capable of driving subsequent logic, for example, CMOS inverter I1, etc. The combined level shifting circuit 100 and the cascode amplifier circuit 200 provide, according to the present invention, a reliable low voltage sense amplifier circuit (e.g., 1.2 volt, more preferably 1.5 volt power supply voltage).

The performance of the level shifting circuit 100 and the sense amplifier circuit 400, as a function of the power supply voltage, will now be discussed with reference to FIG. 5.

Figure 5:
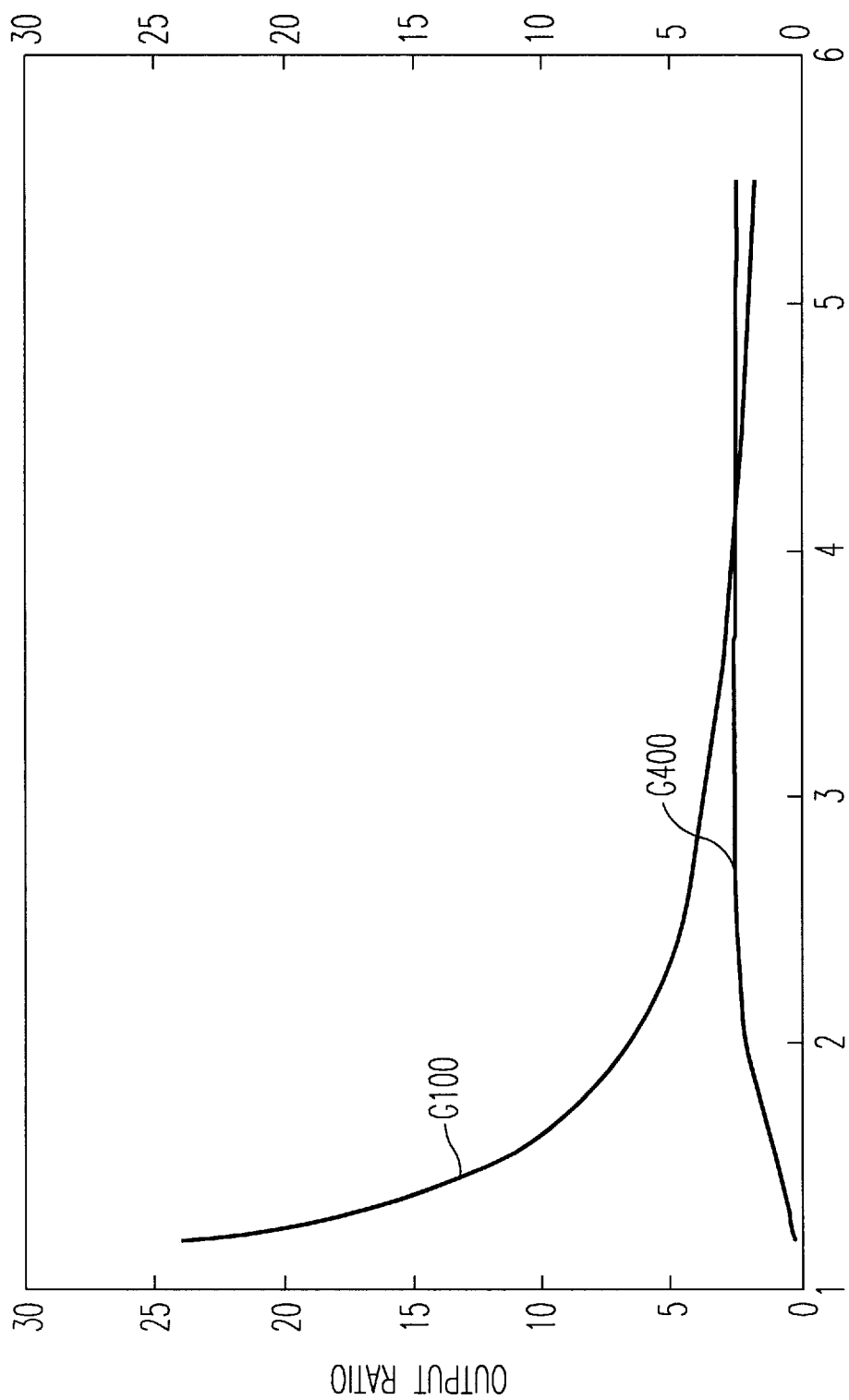
FIG. 5 is a plot showing gain of the level shifting circuit of FIG. 1 and gain of the sense amplifier circuit of FIG. 4 as a function of a power supply voltage.

In FIG. 5, the gain ($G_{100}$) of the level shifting circuit 100 and gain ($G_{400}$) of the sense amplifier circuit 400 as a function of the power supply voltage (Vdd) is shown. Referring to FIG. 5, the gain ($G_{100}$) of the level shifting circuit 100 increases rapidly, whereas the gain ($G_{400}$) of the sense amplifier circuit 400 decreases rapidly, as the power supply voltage is decreased below 2 volts. In addition, the gain ($G_{100}$) of the level shifting circuit 100 is greater than the gain ($G_{400}$) of the sense amplifier circuit 400 up to a power supply voltage of about 4 volts. Accordingly, the gain function of the level shifting circuit 100, appears to increase exponentially as the power supply voltage decreases and which may be limited only by the minimum operating voltage of the circuit, as opposed to the gain function of the sense amplifier circuit 400, which decreases with decreasing power supply voltage, dramatically so below about 2 volts.

Although the preferred embodiments of the level shifting circuit are described in terms of N-channel and P-channel conductivity type devices, the present invention could be adapted for use with other conductivity type devices, as will be apparent to those skilled in the electronic arts.

Similarly, although the preferred embodiment of the level shifting circuit is described in terms of SRAM memory devices (see, e.g., "Memory 1996", published by Integrated Circuits Engineering Corp., Scottsdale Ariz.; pp. 8-1 through 8-17, incorporated herein by reference), the present invention could be adapted for use with other types of memory devices, such as dynamic RAM (DRAM), video RAM (VRAM), audio RAM (ARAM), pseudo-static RAM (PSRAM), etc. (see, e.g., "Memory 1996", pp. 7-1 through 7-19, incorporated herein by reference); read only memory (ROM), programmable ROM (PROM), erasable PROM (EPROM), electrically erasable PROM ($E^2$ PROM), etc. (see "Memory 1996", pp. 9-1 through 9-14, incorporated herein by reference); and flash memory (see "Memory 1996", pp. 10-1 through 10-10, incorporated herein by reference), as will be apparent to those skilled in the electronic arts.

Further, although the preferred embodiment of the level shifting circuit are described in terms of a differential level shifting circuit, the present invention could be adapted for use as a single-ended level shifting circuit or as a one-stage sense amplifier, as will be apparent to those skilled in the electronic arts.

Still further, although the preferred embodiment of the sense amplifier circuit are described in terms of an amplification stage such as a cascode amplifier, the present invention could be adapted for use with other types of amplification stages, as will be apparent to those skilled in the electronic arts.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of The United States is:

1. A level shifting circuit, comprising:
   at least one load transistor, of a first conductivity type, having a source-drain path arranged between the first and second power supply voltages, and a gate directly coupled to one of the first and second power supply voltages;
   at least one gain transistor, of a second conductivity type, having a source-drain path arranged between the first and second power supply voltages, and a gate; and
   at least one reference transistor, of a second conductivity type, having a source-drain path arranged between the first and second power supply voltages, and a gate coupled to a node connecting the source-drain path of the at least one load transistor with the source-drain path of the at least one gain transistor;
   wherein the level shifting circuit is configured so that a magnitude of the difference between the first and second power supply voltages is 4 volts or less.

2. The level shifting circuit according to claim 1, wherein the gate of the at least one gain transistor is configured as an input node and the gate of the at least one reference transistor is configured as an output node.

3. The level shifting circuit according to claim 2, wherein the level shifting circuit is configured so that an output signal generated at the output node is level shifted with respect to an input signal applied to the input node.

4. The level shifting circuit according to claim 1, wherein the level shifting circuit is configured so that when the input signal applied to the input node is a signal with a voltage magnitude no greater than 50 millivolts, the output signal generated at the output node is level shifted to a voltage magnitude of at least 900 millivolts.

5. A level shifting circuit according to claim 1, wherein the level shifting circuit is configured so that a magnitude of the difference between the first and second power supply voltages is 2 volts or less.

6. A level shifting circuit according to claim 1, wherein the level shifting circuit is configured so that a magnitude of the difference between the first and second power supply voltages is 1.5 volts or less.

7. A level shifting circuit, comprising:
   at least one load transistor, of a first conductivity type, having a source-drain path arranged between the first and second power supply voltages, and a gate coupled to one of the first and second power supply voltages;
   at least one gain transistor, of a second conductivity type, having a source-drain path arranged between the first and second power supply voltages, and a gate; and
   at least one reference transistor, of a second conductivity type, having a source-drain path arranged between the first and second power supply voltages, and a gate coupled to a node connecting the source-drain path of the at least one load transistor with the source-drain path of the at least one gain transistor;

wherein the gate of the at least one gain transistor is configured as an input node and the gate of the at least one reference transistor is configured as an output node;

wherein the level shifting circuit is configured so that an output signal generated at the output node is level shifted with respect to an input signal applied to the input node; and wherein the level shifting circuit is configured so that when the input signal applied to the input node is a signal with a voltage magnitude no greater than 50 millivolts, the output signal generated at the output node is level shifted to a voltage magnitude of at least 900 millivolts.

8. The level shifting circuit according to claim 7, wherein the first conductivity type is a P-channel type and the second conductivity type is an N-channel type.

9. A level shifting circuit, operating from a first and second power supply voltage, comprising:

first and second load transistors each having a source-drain path arranged between the first and second power supply voltages, and a gate coupled to one of the first and second power supply voltages;

first and second gain transistors each having a source-drain path arranged between the respective source-drain paths of the first and second load transistors and one of the first and second power supply voltages, and a gate; and first and second reference transistors each having a source-drain path arranged between the first and second power supply voltages, and a gate coupled to respective first and second nodes, the first node connecting the source-drain path of the first load transistor with the source-drain path of the first gain transistor, and the second node connecting the source-drain path of the second load transistor with the source-drain path of the second gain transistor.

10. The level shifting circuit according to claim 9, wherein the gates of the first and second gain transistors are configured as differential input nodes and the gates of the first and second reference transistors are configured as differential output nodes.

11. The level shifting circuit according to claim 10, wherein the level shifting circuit is configured so that a differential output signal generated at the differential output nodes is level shifted with respect to a differential input signal applied to the differential input nodes.

12. The level shifting circuit according to claim 11, wherein the level shifting circuit is configured so that when the differential input signal applied to the differential input nodes is a signal with a differential voltage magnitude no greater than 50 millivolts, the differential output signal generated at the differential output nodes is level shifted to a differential voltage magnitude of at least 900 millivolts.

13. The level shifting circuit according to any one of claims 9 to 12, wherein the first and second load transistors are of a P-channel conductivity type and the first and second gain and reference transistors are of an N-channel conductivity type.

14. The level shifting circuit according to any one of claims 9 to 12, wherein the level shifting circuit is configured so that a magnitude of the difference between the first and second power supply voltages is 1.5 volts or less.

15. The level shifting circuit according to any one of claims 9 to 12, wherein a reference node connects the source-drain paths of the first and second gain transistors with the source-drain paths of the first and second reference transistors.

16. A sense amplifier circuit, operating from a first and second power supply voltage, comprising:

the level shifting circuit, including, first and second load transistors each having a source-drain path arranged between the first and second power supply voltages, and a gate coupled to one of the first and second power supply voltages, first and second gain transistors each having a source-drain path arranged between the respective source-drain paths of the first and second load transistors and one of the first and second power supply voltages, and a gate, and first and second reference transistors each having a source-drain path arranged between the first and second power supply voltages, and a gate coupled to respective first and second nodes, the first node connecting the source-drain path of the first load transistor with the source-drain path of the first gain transistor, and the second node connecting the source-drain path of the second load transistor with the source-drain path of the second gain transistor; and an amplification stage coupled to the level shifting circuit.

17. The sense amplifier circuit according to claim 16, wherein the amplification stage comprises:

third and fourth load transistors each having a source-drain path arranged between the first and second power supply voltages, and a gate coupled to one of the first and second power supply voltages;

third and fourth gain transistors each having a source-drain path arranged between the respective source-drain paths of the third and fourth load transistors and one of the first and second power supply voltages, and a gate; and a third reference transistor having a source-drain path arranged between the first and second power supply voltages, and a gate coupled to a node connecting the source-drain path of the third load transistor with the source-drain path of the third gain transistor.

18. The sense amplifier circuit according to claim 17, wherein the gates of the third and fourth gain transistors are configured as differential input nodes and an output node connects the source-drain path of the fourth load transistor with the source-drain path of the fourth gain transistor.

19. The sense amplifier circuit according to claim 18, wherein the third and fourth load transistors are of a P-channel conductivity type and the third and fourth gain transistors and the third reference transistor are of an N-channel conductivity type.

20. The sense amplifier circuit according to claim 19, wherein the level shifting circuit is configured so that a magnitude of the difference between the first and second power supply voltages is 1.5 volts or less.

21. The sense amplifier circuit according to claim 20, wherein a common node connects the source-drain paths of the third and fourth gain transistors with the source-drain path of the third reference transistor.

22. A sense amplifier circuit, operating from a first and second power supply voltage, comprising:

the level shifting circuit, including, at least one load transistor, of a first conductivity type, having a source-drain path arranged between the first and second power supply voltages, and a gate directly coupled to one of the first and second power supply voltages, at least one gain transistor, of a second conductivity type, having a source-drain path arranged between the first and second power supply voltages, and a gate, and at least one reference transistor, of a second conductivity type, having a source-drain path arranged between the first and second power supply voltages, and a gate coupled to a node connecting the source-drain path of the at least one load transistor with the source-drain path of the at least one gain transistor, wherein the level shifting circuit is configured so that a magnitude of the difference between the first and second power supply voltages is 4 volts or less; and an amplification stage coupled to the level shifting circuit.

23. The sense amplifier circuit according to claim 22, wherein the amplification stage comprises:

third and fourth load transistors each having a source-drain path arranged between the first and second power supply voltages, and a gate coupled to one of the first and second power supply voltages;

third and fourth gain transistors each having a source-drain path arranged between the respective source-drain paths of the third and fourth load transistors and one of the first and second power supply voltages, and a gate; and a third reference transistor having a source-drain path arranged between the first and second power supply voltages, and a gate coupled to a node connecting the source-drain path of the third load transistor with the source-drain path of the third gain transistor.

24. The sense amplifier circuit according to claim 23, wherein the gates of the third and fourth gain transistors are configured as differential input nodes and an output node connects the source-drain path of the fourth load transistor with the source-drain path of the fourth gain transistor.

25. The sense amplifier circuit according to claim 24, wherein the third and fourth load transistors are of a P-channel conductivity type and the third and fourth gain transistors and the third reference transistor are of an N-channel conductivity type.

26. The level shifting circuit according to claim 25, wherein the level shifting circuit is configured so that a magnitude of the difference between the first and second power supply voltages is 1.5 volts or less.

27. The level shifting circuit according to claim 26, wherein a common node connects the source-drain paths of the third and fourth gain transistors with the source-drain path of the third reference transistor.

* * * * *